(12) United States Patent
Ma et al.

(10) Patent No.: US 11,379,069 B2
(45) Date of Patent: Jul. 5, 2022

(54) SENSOR, DISPLAY PANEL AND DISPLAY DEVICE

(71) Applicant: Xiamen Tianma Micro-Electronics Co., Ltd., Xiamen (CN)

(72) Inventors: Shaolong Ma, Shanghai (CN); Feng Lu, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 17/147,011

(22) Filed: Jan. 12, 2021

(65) Prior Publication Data
US 2021/0132729 A1    May 6, 2021

(30) Foreign Application Priority Data
Sep. 29, 2020    (CN) .......................... 202011052708.3

(51) Int. Cl.
| | |
|---|---|
| G06F 3/041 | (2006.01) |
| G02F 1/1368 | (2006.01) |
| G01L 1/20 | (2006.01) |
| G01L 1/22 | (2006.01) |
| G02F 1/1333 | (2006.01) |

(Continued)

(52) U.S. Cl.
CPC ............ *G06F 3/0414* (2013.01); *G01L 1/205* (2013.01); *G01L 1/2262* (2013.01); *G02F 1/13338* (2013.01); *G02F 1/13685* (2021.01); *H01L 27/323* (2013.01); *H01L 27/3272* (2013.01); *G02F 1/133305* (2013.01); *G06F 2203/04102* (2013.01); *G06F 2203/04107* (2013.01); *H01L 51/0097* (2013.01); *H01L 2251/5338* (2013.01)

(58) Field of Classification Search
CPC ......... G06F 3/0414; G06F 2203/04102; G06F 2203/04107; G06F 3/04144; G01L 1/205; G01L 1/2262; G01L 1/247; G01L 11/02; G01L 19/083; G02F 1/13338; G02F 1/13685; G02F 1/133305; G02F 1/1333; H01L 27/323; H01L 27/3272; H01L 51/0097; H01L 2251/5338; H01L 27/3225; G01B 7/18; H05K 9/002; H05K 9/0054

See application file for complete search history.

(56) References Cited

U.S. PATENT DOCUMENTS

| | | | |
|---|---|---|---|
| 10,444,490 B1 * | 10/2019 | Guntaka | .............. G02B 26/005 |
| 2011/0271772 A1 | 11/2011 | Parks et al. | |

(Continued)

FOREIGN PATENT DOCUMENTS

CN    111430369 A    7/2021

*Primary Examiner* — Chad M Dicke
(74) *Attorney, Agent, or Firm* — Alston & Bird LLP

(57) ABSTRACT

Provided are a sensor, a display panel and a display device. The sensor includes: a flexible film; a first carrier substrate disposed opposite to and spaced apart from the flexible film; a protrusion structure disposed on a side, facing toward the flexible film, of the first carrier substrate; multiple sensing units located on a side, facing toward the first carrier substrate, of the flexible film; where a perpendicular projection of the protrusion structure on a plane where the flexible film is located does not overlap perpendicular projections of the multiple sensing units on the plane where the flexible film is located; and a shielding structure, which is disposed at least partially around the protrusion structure.

20 Claims, 12 Drawing Sheets

(51) Int. Cl.
*H01L 27/32* (2006.01)
*H01L 51/00* (2006.01)

(56) References Cited

U.S. PATENT DOCUMENTS

2017/0115792 A1* 4/2017 Nishimura ............ G06F 3/0416
2017/0131834 A1* 5/2017 Kim .................... G02F 1/13338
2017/0153752 A1* 6/2017 Kurasawa ............ G09G 3/3677
2017/0160766 A1* 6/2017 Gupta ................... G02F 1/1368

* cited by examiner

SENSOR, DISPLAY PANEL AND DISPLAY DEVICE

CROSS-REFERENCE TO RELATED APPLICATION

This application claims priority to Chinese Patent Application No. CN202011052708.3 filed Sep. 29, 2020 at CNIPA, entitled "SENSOR, DISPLAY PANEL AND DISPLAY DEVICE", the disclosure of which is incorporated herein by reference in its entirety.

TECHNICAL FIELD

The present disclosure relates to pressure detection technologies and, in particular, to a sensor on a display panel and a display device.

BACKGROUND

A strain sensor is a kind of sensor based on measuring the deformation from a strain generated by an object under force. The strain sensor can convert the detected mechanical deformation into an electrical signal, thus acquiring the deformation characteristic of the measured object. The strain sensor is of great significance and promising in fields such as display, biomedicine and robotics.

The strain sensors in the existing arts include flexible substrates and sensing units disposed on the flexible substrates. When the strain sensors are subjected to an external pressure, the flexible substrates generate a strain, and the strain of the flexible substrate causes the sensing units to respond.

However, when the strain sensors are subjected to the external pressure, an external signal may interfere with the sensing units in the sensors, which will affect the detection performance of the strain sensors.

SUMMARY

In view of this, the present disclosure provides a sensor, a display panel and a display device, which reduce the interference of the external signal to the sensor, and improves the detection performance of the sensor.

In a first aspect, the present disclosure provides a sensor. The sensor includes: a flexible film; a first carrier substrate disposed opposite to and spaced apart from the flexible film; a protrusion structure disposed on a side, facing toward the flexible film, of the first carrier substrate; multiple sensing units located on a side, facing toward the first carrier substrate, of the flexible film, where a perpendicular projection of the protrusion structure on a plane where the flexible film is located does not overlap perpendicular projections of the multiple sensing units on the plane where the flexible film is located; and a shielding structure, which is disposed at least partially around the protrusion structure, and a perpendicular projection of the shielding structure on the plane where the flexible film is located is between the perpendicular projection of the protrusion structure on the plane where the flexible film is located and perpendicular projections of multiple sensing units adjacent to the protrusion structure on the plane where the flexible film is located and.

In a second aspect, the present disclosure further provides a display panel including multiple sensors described in the first aspect.

In a third aspect, the present disclosure further provides a display device including the display panel provided in the second aspect.

BRIEF DESCRIPTION OF DRAWINGS

Other features, objects and advantages of the present disclosure will become more apparent from a detailed description of non-restrictive embodiments with reference to the drawings.

DETAILED DESCRIPTION

Figure 1:
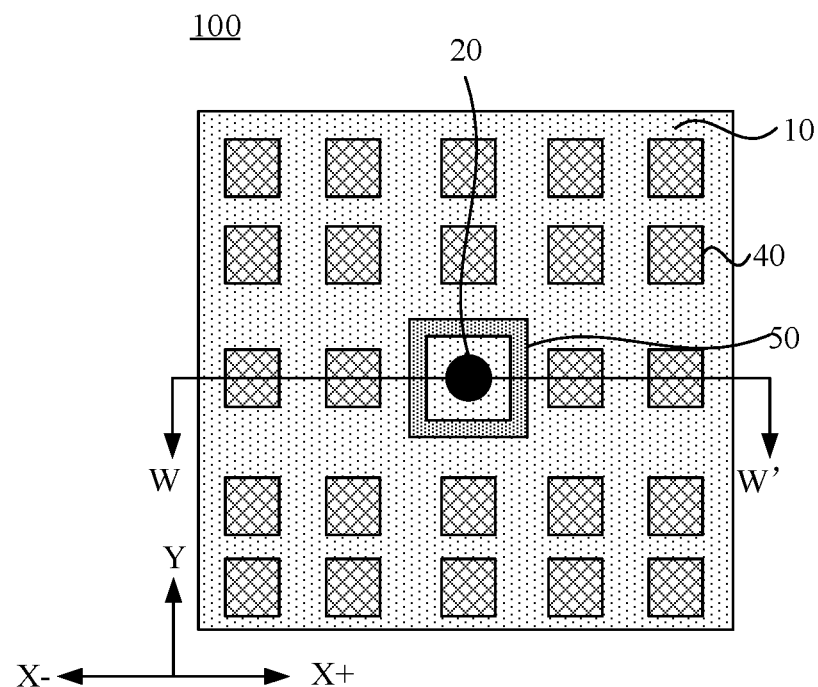
FIG. 1 is a top view of a strain sensor provided by an embodiment of the present disclosure.

To make the objects, technical solutions and advantages of the present disclosure clearer, the technical solutions of the present disclosure will be completely described below in conjunction with the specific embodiments and the drawings in the embodiments of the present disclosure. Apparently, the embodiments described herein are part, not all, of the embodiments of the present disclosure, and based on the embodiments of the present disclosure, all other embodiments obtained by those skilled in the art on the premise that no creative work is done are within the scope of the present disclosure.

In view of the problems described in the Background, embodiments of the present disclosure provide a strain sensor, including: a flexible film; a first carrier substrate disposed opposite to and spaced apart from the flexible film; a protrusion structure disposed on a side, facing toward the flexible film, of the first carrier substrate; multiple sensing units located on a side, facing toward the first carrier substrate, of the flexible film; where a perpendicular projection of the protrusion structure on a plane where the flexible film is located does not overlap the perpendicular projections of the multiple sensing units on the plane where the flexible film is located; and a shielding structure, which is disposed at least partially around the protrusion structure, and a perpendicular projection of the shielding structure on the plane where the flexible film is located is between the perpendicular projection of the protrusion structure on the plane where the flexible film is located and perpendicular projections of multiple sensing units adjacent to the protrusion structure on the plane where the flexible film is located.

With the above technical disclosure, the protrusion structure is disposed on a side, facing toward the flexible film, of the first carrier substrate, so that when the object contacts the sensor, the pressure received by the sensor is passed through the protrusion structure into the carrier substrate. In this way, the sensing units can not only determine the pressure when the object contacts the sensor, but also accurately sense the direction from which the pressure comes. In addition, in this embodiment, the shielding structure is disposed between the protrusion structure and the sensing units so that the external interfering signal to the sensing units is shielded by the shielding structure, thereby avoiding the external signals being sensed to the sensing units through the protrusion structure (which influences the response of the sensing units and then influences the detection accuracy), and thus improving the detection performance of the sensor.

The above is the basic concept of the present disclosure, and solutions in the embodiments of the present disclosure will be described clearly and completely in conjunction with the drawings in the embodiments of the present disclosure. Based on the embodiments of the present disclosure, all other embodiments obtained by those skilled in the art without creative work are within the scope of the present disclosure.

Figure 2:
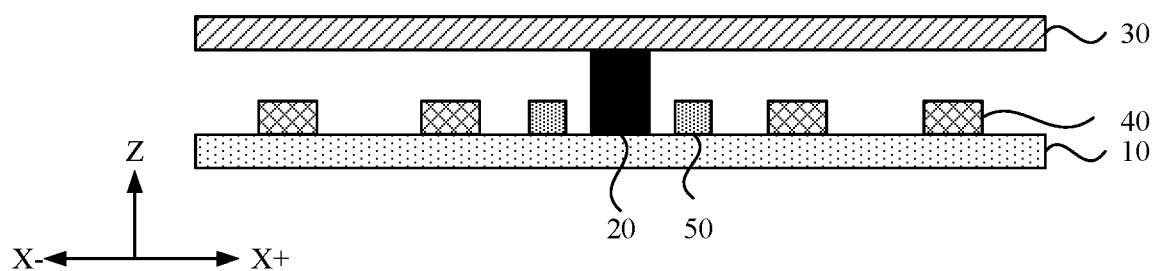
FIG. 2 is a cross sectional view taken along line WW' of FIG. 1.

FIG. 1 is a top view of a sensor provided by an embodiment of the present disclosure. FIG. 2 is a cross sectional view taken along line WW' of FIG. 1. As shown in FIGS. 1 and 2, a sensor 100 provided by the embodiment of the present disclosure includes a flexible film 10; a first carrier substrate 30 disposed opposite to and spaced apart from the flexible film 10; at least one protrusion structure 20 disposed on a side, facing toward the flexible film 10, of the first carrier substrate 30; multiple sensing units 40 located on a side of the flexible film 10, facing toward the first carrier substrate 30; where a perpendicular projection of each of the at least one protrusion structure 20 on a plane where the flexible film 10 is located does not overlap the perpendicular projections of the multiple sensing units 40 on the plane where the flexible film 10 is located; and a shielding structure 50, which is disposed at least partially around the at least one protrusion structure 20, and a perpendicular projection of the shielding structure 50 on the plane where the flexible film is located is between the perpendicular projection of the at least one protrusion structure 20 on the plane where the flexible film 10 is located and the perpendicular projections of multiple sensing units 40 adjacent to the at least one protrusion structure on the plane where the flexible film 10 is located.

It is to be noted that in order to clearly show a relative position relationship among the shielding structure 50, the at least one protrusion structure 20 and the sensing units 40, the top view of the sensor 100 does not show the first carrier substrate 30, which goes the same in the following embodiments, and will not be discussed further in the following embodiments.

In a case where the sensor 100 is not in contact with an object, the at least one protrusion structure 20 is not in contact with the flexible film 10; alternatively, the at least one protrusion structure 20 is in contact with the flexible film 10, but does not cause a strain on the flexible film 10, that is, the sensing units 40 does not respond at this time.

Figure 3:
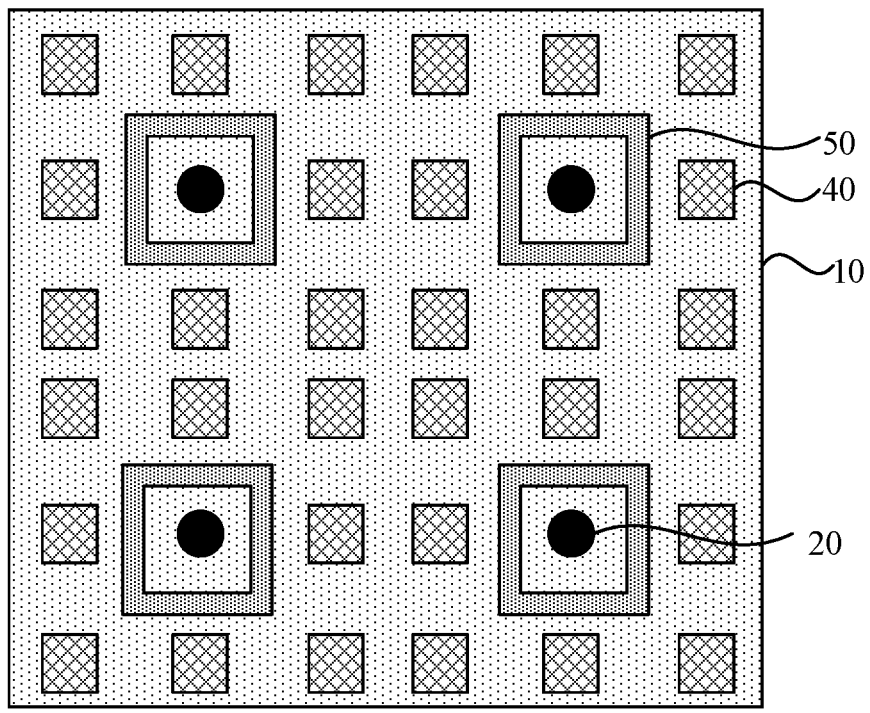
FIG. 3 is a top view of another strain sensor provided by an embodiment of the present disclosure.

The number of the protrusion structures 20 may be one, for example, referring to FIG. 1; the number of the protrusion structures 20 may also be more than one, and in a case where the number of the protrusion structures 20 is more than one, there are multiple corresponding sensing units 40 around each protrusion structure 20, for example, referring to FIG. 3.

Specifically, in a case where the sensor 100 is in contact with an object, the at least one protrusion structure 20 is in contact with the flexible film 10 and causes a strain on the flexible film 10, the strain of the flexible film 10 causes the sensing units 40 to respond, that is, the sensing units 40 output a detection signal to a processor, the processor determines a magnitude of the pressure between the sensor 100 and the object; meanwhile, in this embodiment, the at least one protrusion structure 20 is provided so that a direction of the pressure can be accurately sensed. For example, in a case where a force sensed by the sensor 100 is a force in an oblique direction (between a Z direction and an X+ direction), where the force in the oblique direction is an applied force in a direction which is not perpendicular to the flexible film 10 but has an included angle with the flexible film 10 (this included angle may be, for example, greater than 0° and less than 90°), the at least one protrusion structure 20 also has a certain included angle with the flexible film 10, which may be, for example, the same as the included angle between the force in the oblique direction and the flexible film 10. In this case, in a case where the at least one protrusion structure 20 is in contact with the flexible film 10 and causes deformation of the flexible film 10, an amount of deformation of the flexible film 10 in the X+ direction is larger than a amount of deformation of the flexible film 10 in the X− direction, so that an electrical signal output by the sensing units 40 on the flexible film 10 in the X+ direction is different from an electrical signal output by the sensing units 40 on the flexible film 10 in the X− direction, and thus the direction of the pressure may be determined. That is, through configuring the at least one protrusion structure 20, this embodiment can not only determine the magnitude of the pressure when the object contacts the sensor 100, but also accurately sense the direction of the pressure.

In addition, the inventor further studied and found that some of the interference signals come from the contacted objects, such as human fingers, and a material of the at least one protrusion structure 20 is generally a silicon-based material, and is made by an MEMS manufacturing process (not limited to this material and this process), so when a person's finger touches the sensor 100, the static electricity of the human body may cause electrostatic interference to the sensing units 40 when the at least one protrusion structure 20 contacts the flexible film 10. Further, in this embodiment, a shielding structure 50 is disposed between the at least one protrusion structure 20 and the sensing units 40 so that the signal interference of the external signals to the sensing units 40 is shielded by the shielding structure, thereby avoiding the static electricity of the object being sensed to the sensing units 40 through the protrusion structure 20, which influences the response of the sensing units 40, and further influences the detection accuracy, and thus improving the detection performance of the sensor 100.

Optionally, the material of the flexible film 10 may include, for example, polyimide, polyethylene terephthalate or polyethylene napthalate, thus ensuring that the flexible film 10 has better flexibility. Of course, the material of the flexible film 10 is not limited to the above materials, and other materials suitable for bending deformation and suitable for a flexible substrate of the sensor 100 may be selected.

Optionally, the protrusion structure 20 may be integrated with the first carrier substrate 30, or may be independently disposed on the first carrier substrate 30, which is not specifically limited in this embodiment.

Optionally, the sensing units 40 may include, for example, a metal strain device in which 4 resistors form a wheatstone bridge, a semiconductor strain device in which 4 resistors form a wheatstone bridge, or the like.

Optionally, the material of the shielding structure 50 may include, for example, a metal material; or the shielding structure 50 is a structure having a fixed potential.

Optionally, the shielding structure 50 may be disposed partially or totally around the protrusion structure 20.

In summary, in the sensor provided by the embodiments of the present disclosure, the at least one protrusion structure is disposed on a side, facing toward the flexible film, of the first carrier substrate so that when the object contacts the sensor, the pressure received by the sensor is passed through the protrusion structure. In this way, the sensing units can not only determine the pressure when the object contacts the sensor, but also accurately sense the direction of the pressure. In addition, in this embodiment, the shielding structure is disposed between the at least one protrusion structure and the sensing units, and the signal interference of the external signals to the sensing units is shielded by the shielding structure, thereby avoiding the external signals being sensed to the sensing units through the at least one protrusion structure, which influences the response of the sensing units and further influences the detection accuracy, and thus improving the detection performance of the sensor.

Figure 4:
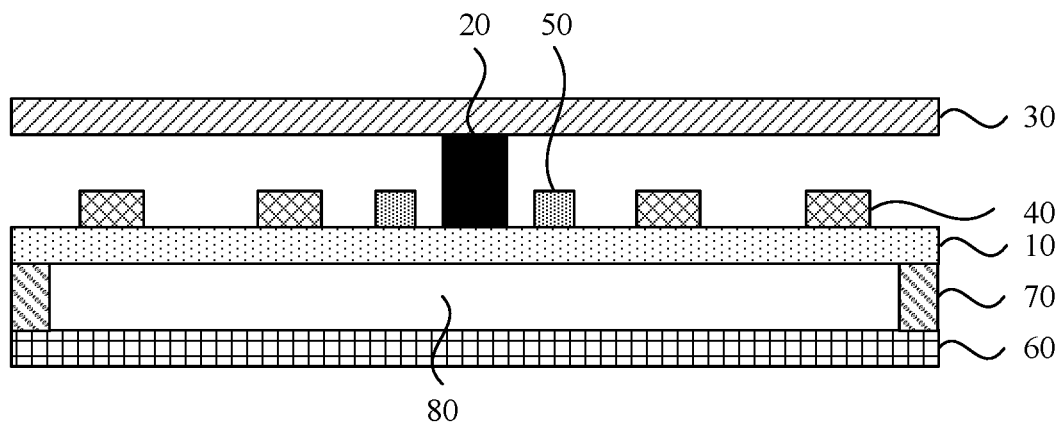
FIG. 4 is a structural view of a film layer of a strain sensor provided by an embodiment of the present disclosure.

Optionally, FIG. 4 is a structural view of a film layer of a sensor provided by an embodiment of the present disclosure. As shown in FIG. 4, the sensor 100 further includes: a second carrier substrate 60 located on a side, facing away from the multiple sensing units 40, of the flexible film 10; a support portion 70 located on a side, facing toward the flexible film 10, of the second carrier substrate 60, where the support portion 70 and the second carrier substrate 60 may be independent structures, or may be an integrated structure; the second carrier substrate 60 and the support portion 70 constitute a cavity structure 80; the flexible film 10 is disposed on the support portion 70; where the perpendicular projections of the multiple sensing units 40 on the plane where the flexible film 10 is located is within a perpendicular projection of the cavity structure 80 on the plane where the flexible film 10 is located; and the perpendicular projection of the protrusion structure 20 on the plane where the flexible film 10 is located is within the perpendicular projection of the cavity structure 80 on the plane where the flexible film 10 is located.

That is, a position of the flexible film 10 corresponding to the protrusion structure 20 and the sensing units 40 is vacant so that a deformation space may be provided for the pressing and the detection sensitivity and accuracy may be improved. Since the pressing deformation is much easier to conduct the static electricity, the influence of the static electricity on the sensing units 40 may be shielded by the shielding structure 50 in the present disclosure. In addition, the second carrier substrate 60, the support portion 70 and the cavity structure 80 are provided so that damage to the flexible film 10 due to excessive deformation is avoided and the structure reliability of the sensor 100 is improved.

Figure 5:
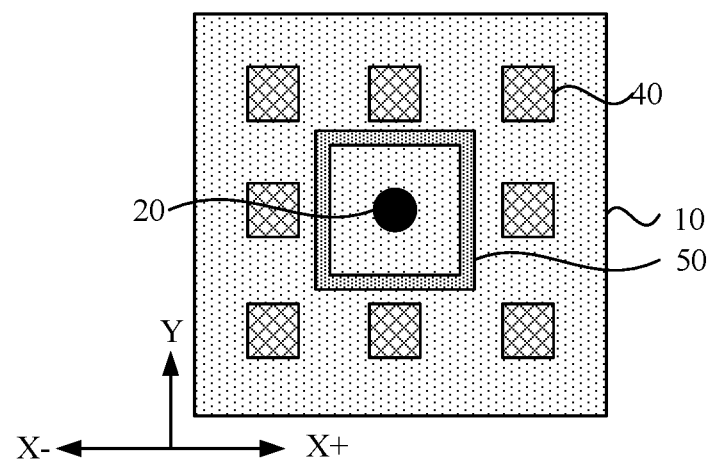
FIG. 5 is a top view of another strain sensor provided by an embodiment of the present disclosure.

Optionally, FIG. 5 is a top view of another sensor provided by an embodiment of the present disclosure. As shown in FIG. 5, the multiple sensing units 40 are disposed around the protrusion structure 20; a distance from the perpendicular projection of the shielding structure 50 on the plane where the flexible film 10 is located to the perpendicular projection of the protrusion structure 20 on the plane where the flexible film 10 is located is greater than a distance from the perpendicular projection of the shielding structure 50 on the plane where the flexible film 10 is located to a perpendicular projection of each of the multiple sensing units 40 adjacent to the protrusion structure 20 on the plane where the flexible film 10 is located.

It can be known from the above that, the protrusion structure 20 is configured to transmit a pressure applied to the sensor 100, and the applied pressure may be a pressure in an oblique direction. In a case where the applied pressure is the pressure in the oblique direction, the protrusion structure 20 also has an included angle with the flexible membrane 10, that is, the protrusion structure 20 not only moves in a Z direction (perpendicular to both X and Y directions), but also has a small range of movement in at least one of an X direction or a Y direction. If the shielding structure 50 is disposed closer to the protrusion structure 20, the movement of the protrusion structure 20 in at least one of the X direction or the Y direction is influenced, thereby influencing the determination of the direction of the pressure applied to the sensor 100. Therefore, in this embodiment, the distance from the perpendicular projection of the shielding structure 50 on the plane where the flexible film 10 is located to the perpendicular projection of the protrusion structure 20 on the plane where the flexible film 10 is located is greater than the distance from the perpendicular projection of the shielding structure 50 on the plane where the flexible film 10 is located to the perpendicular projection of each of the multiple sensing units 40 adjacent to the protrusion structure 20 on the plane where the flexible film 10 is located, so that on one hand, it is ensured that the protrusion structure 20 has a space for moving when the pressure applied to the flexible film 10 is the pressure in the oblique direction, and on the other hand, the shielding structure 50 is disposed closer to the sensing unit 40, so that the signal interference of external signals to the sensing unit 40 may be better shielded and the detection performance of the sensor 100 is improved.

Optionally, the shielding structure includes at least one shielding unit. In a case where the shielding structure includes M shielding units, the M shielding units are located in a same film layer or at most partially in different film layers and partially in the same film, where M is a positive integer greater than or equal to 2.

The material of the at least one shielding unit may include, for example, a metal material; or the at least one shielding unit includes a structure having a fixed potential or the like, as long as the function of shielding the signal can be achieved.

In a case where the shielding structure includes one shielding unit, the structure is simple, and the signal interference of the external signals to the sensing units may be shielded. In a case where the shielding structure includes M shielding units, the signal interference of the external signals to the sensing units may be better shielded.

The M shielding units are located within the sensor in a variety of ways, for example, the M shielding units are located in the same film layer or at least partially in different film layers, which will be described with typical examples below in detail. In order to describe the subsequent solution more clearly and more conveniently, it is provided that each shielding unit includes a shielding ring disposed around the protrusion structure. The contents described below are not intended to limit the present disclosure.

Figure 6:
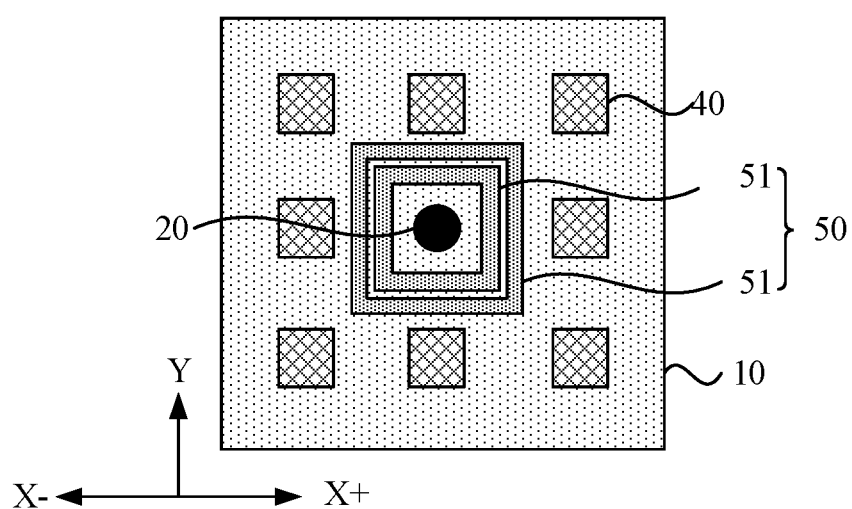
FIG. 6 is a top view of another strain sensor provided by an embodiment of the present disclosure.

Optionally, FIG. 6 is a top view of another sensor provided by an embodiment of the present disclosure. As shown in FIG. 6, the shielding structure 50 includes multiple shielding rings 51, which may, for example, be located in the same film layer. In this case, the multiple shielding rings 51 are nested with each other so that the signal interference of the external signals to the sensing units 40 in at least one of the X direction or the Y direction may be better shielded by the shielding of the multiple shielding rings 51. This shielding ring has a square shape, but shielding rings are not limited to square shapes only.

Figure 7:
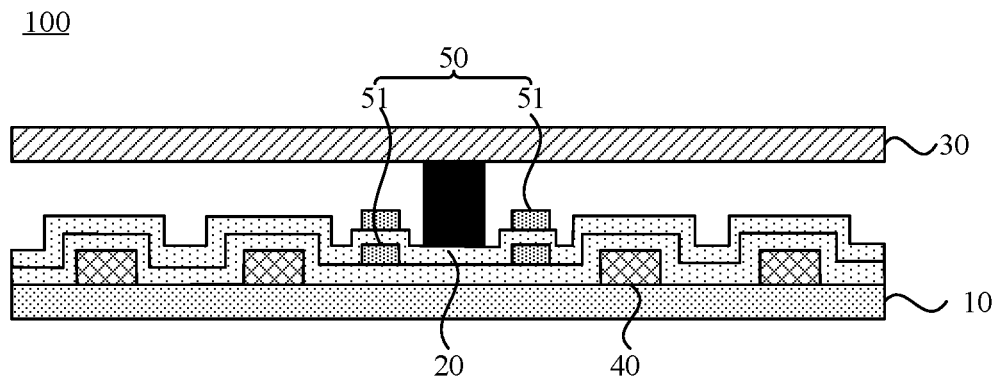
FIG. 7 is a structural view of a film layer of another strain sensor provided by an embodiment of the present disclosure.

Optionally, FIG. 7 is a structural view of a film layer of another sensor provided by an embodiment of the present disclosure. As shown in FIG. 7, the shielding structure 50 includes multiple shielding rings 51, which may, for example, be at most partially located on different film layers, and perpendicular projections of a part of the multiple shield rings 51 on the plane where the flexible film 10 is located overlap. In the case where the multiple shielding rings 51 are at least partially located in different film layers and the perpendicular projections of the part of the multiple shielding rings 51 on the plane where the flexible film 10 is located overlap, the presence of floating of a shielding ring 51, due to the disconnection of the signal line connected to the shielding ring 51 and failure to connect to a shielding potential after multiple deformations of the flexible film 10, can be prevented. It is to be noted that, FIG. 7 just describes an example in which the shielding structure 50 includes two shielding rings 51, and the two shielding rings 51 are located in different film layers.

Figure 8:
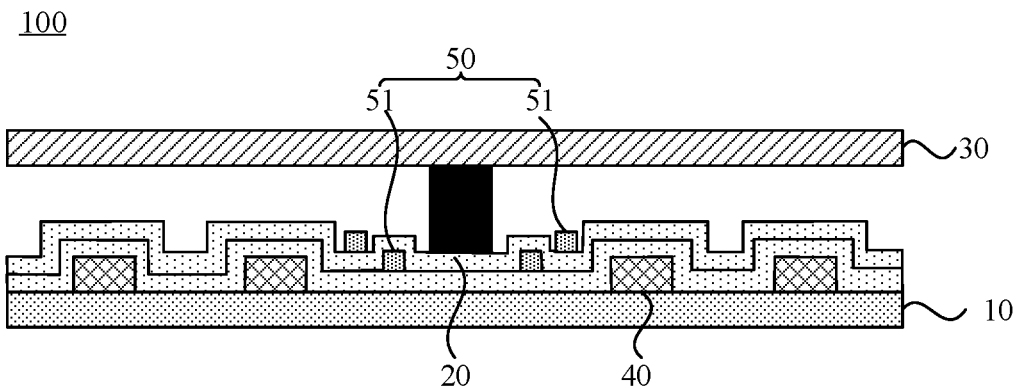
FIG. 8 is a structural view of a film layer of another strain sensor provided by an embodiment of the present disclosure.

Optionally, FIG. 8 is a structural view of a film layer of another sensor provided by an embodiment of the present disclosure. As shown in FIG. 8, the shielding structure 50 includes multiple shielding rings 51, which may be at least partially located on different film layers, and perpendicular projections of a part of the multiple shield rings on the plane where the flexible film is located do not overlap. In this way, the signal interference of the external signals at different positions to the sensing units 40 may be shielded. It is to be noted that, FIG. 8 just describes an example in which the shielding structure 50 includes two shielding rings 51, and the two shielding rings 51 are located in two different film layers.

In addition, continually referring to FIGS. 7 and 8, in a case where the multiple shielding rings 51 are at least partially located in different film layers, a region corresponding to the protrusion structure 20 is recessed while a region surrounding the protrusion structure 20 protrudes, so that the protrusion structure 20 can be prevented from being dislocated.

It is to be noted that the above-mentioned examples are just illustrated by taking an example that the shielding unit includes the shielding square-ring disposed around the protrusion structure, which does not limit the present disclosure. Those skilled in the art can set the shape of the shielding unit according to the actual situation. In a case where the shape of the shielding unit is a shielding ring, the shielding unit can completely block external signals from sensing the sensing units through the protrusion structure. At the same time, the shielding ring may limit the displacement of the protrusion structure through limiting the sliding of the protrusion structure, which improves the stability of the sensor structure and prevents the protrusion structure from scratching other areas.

Figure 9:
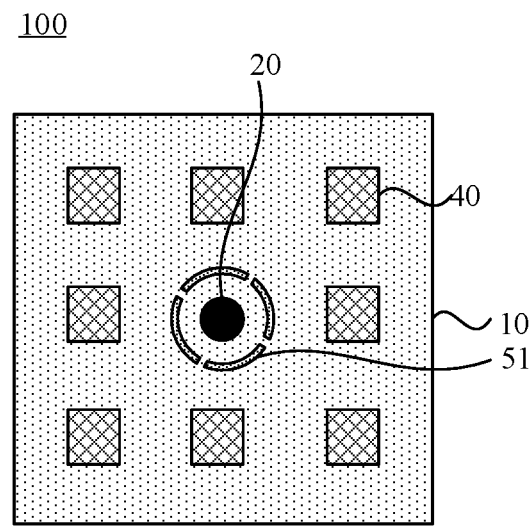
FIG. 9 is a top view of another strain sensor provided by an embodiment of the present disclosure.

Optionally, in a case where the shielding unit is a shielding ring 51, the shielding ring 51 may include a closed shielding ring, for example, continually referring to FIG. 6, and the shielding ring 51 may include a non-closed shielding ring, for example, referring to FIG. 9.

Figure 10:
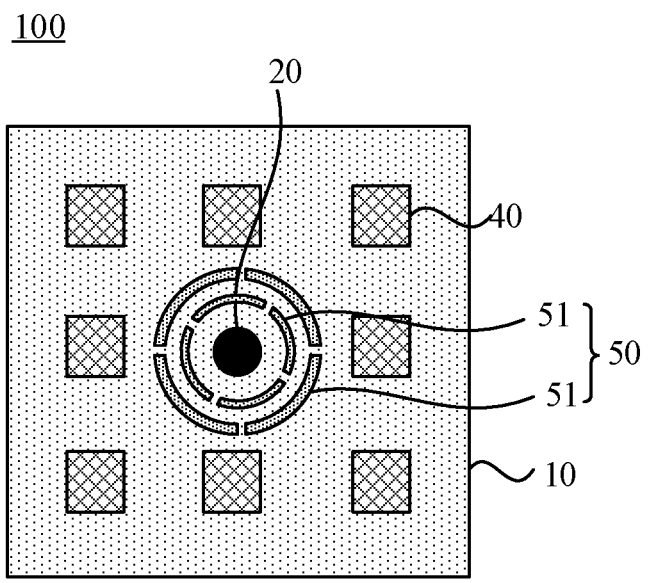
FIG. 10 is a top view of another strain sensor provided by an embodiment of the present disclosure.

Optionally, FIG. 10 is a top view of another sensor provided by an embodiment of the present disclosure. As shown in FIG. 10, in a case where the shielding structure 50 includes multiple non-closed shielding rings, openings of adjacent non-closed shielding rings are staggered.

The advantage of such configuration is that it prevents the external signals from being sensed to the sensing units 40 through the openings of the non-closed shielding rings, which influences the response of the sensing units and further influences the detection accuracy.

Optionally, in a case where the shielding unit is a shielding ring, the shape of the shielding ring includes a circular ring, an elliptical ring, an N-point star ring or an N-sided ring, where N is a positive integer greater than or equal to 3.

Figure 11:
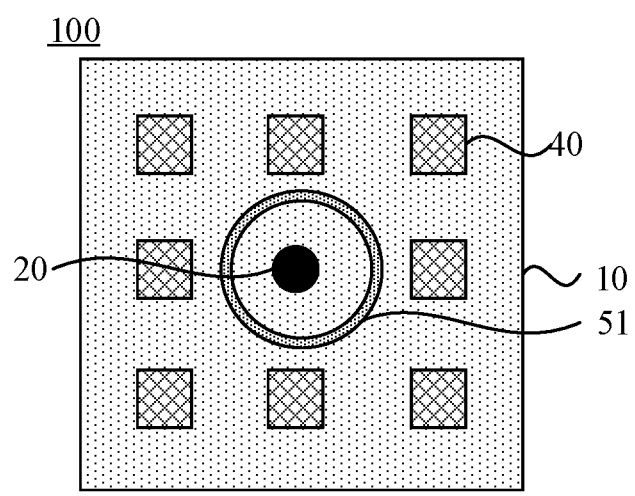
FIG. 11 is a top view of another strain sensor provided by an embodiment of the present disclosure.
Figure 12:
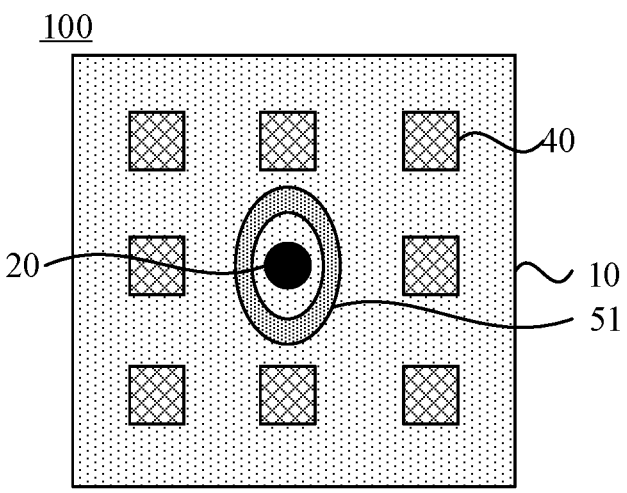
FIG. 12 is a top view of another strain sensor provided by an embodiment of the present disclosure.
Figure 13:
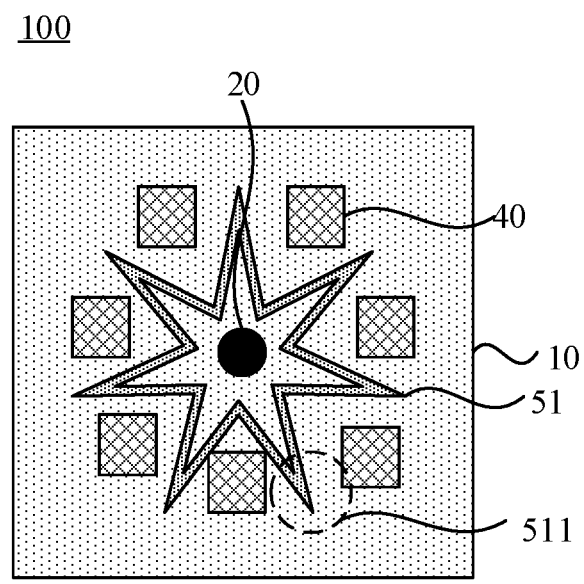
FIG. 13 is a top view of another strain sensor provided by an embodiment of the present disclosure.
Figure 14:
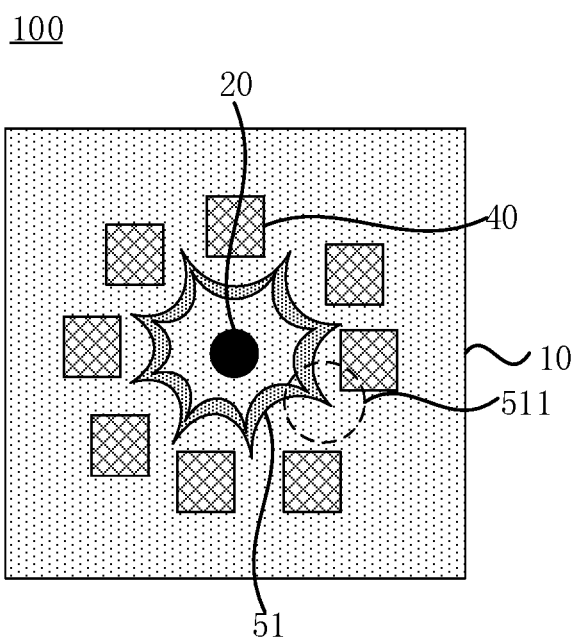
FIG. 14 is a top view of another strain sensor provided by an embodiment of the present disclosure.

Exemplarily, FIG. 11 is a top view of another sensor provided by an embodiment of the present disclosure, and as shown in FIG. 11, the shape of the shielding ring 51 includes a circular ring. Continually referring to FIG. 1, the shape of the shielding ring 51 includes a four-sided ring. FIG. 12 is a top view of another sensor provided by an embodiment of the present disclosure, and as shown in FIG. 12, the shape of the shielding ring 51 includes an elliptical ring. FIG. 13 is a top view of another sensor provided by an embodiment of the present disclosure. FIG. 14 is a top view of another sensor provided by an embodiment of the present disclosure. As shown in FIGS. 13 and 14, the shape of the shielding ring 51 includes a seven-point star ring.

Those skilled in that art can understand that the shape of the shielding ring 51 includes, but is not limited to, the above examples, and those skilled in the art can configure the shape of the shielding ring 51 according to the actual situation, which is not limited in the present disclosure.

Optionally, the shielding ring includes an N-point star ring, and each outwardly-projecting sharp point of the N-point star ring faces toward a gap between respective two adjacent ones of the multiple sensing units; or the shielding ring includes an N-sided ring, each corner of the N-side ring faces toward a gap between respective two adjacent ones of the multiple sensing units.

Figure 15:
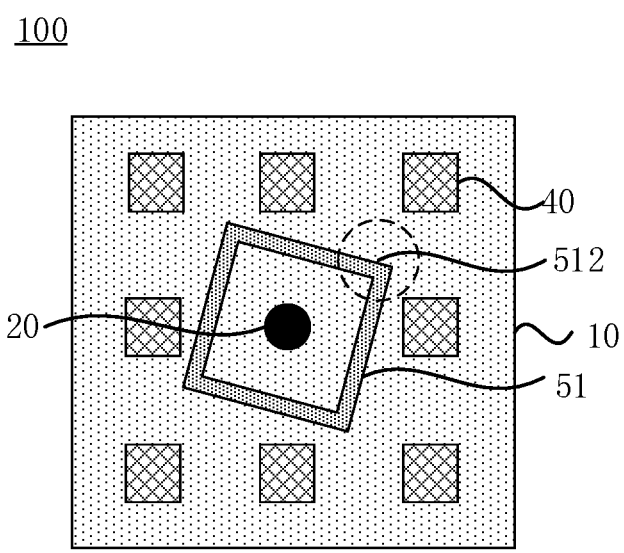
FIG. 15 is a top view of another strain sensor provided by an embodiment of the present disclosure.

Exemplarily, continually referring to FIGS. 13 and 14, the shielding ring 51 includes a seven-point star ring which has seven first sharp point portions 511, and the first sharp point portions 511 are inner angles of the seven-point star ring. A perpendicular projection of each first point portion 511 on the plane where the flexible film 10 is located is located in a gap between perpendicular projections of respective two adjacent ones of the multiple sensing units 40 on the plane where the flexible film 10 is located. Alternatively, FIG. 15 is a top view of another sensor provided by an embodiment of the present disclosure. As shown in FIG. 15, the shielding ring 51 includes a four-sided ring. The four-sided ring includes four second sharp portions 512, and the second sharp portions 512 are inner angles of the four-sided ring. A perpendicular projection of each second sharp portion 512 on the plane where the flexible film 10 is located is located in a gap between perpendicular projections of respective two adjacent ones of the multiple sensing units 40 on the plane where the flexible film 10 is located. In this way, the problems that the point discharge or the point charge concentration influences the response of the sensing units 40 and further influences the detection accuracy may be avoided.

Figure 16:
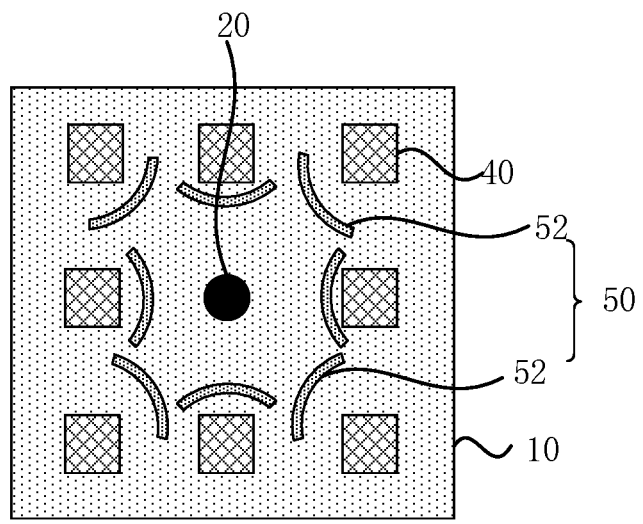
FIG. 16 is a top view of another strain sensor provided by an embodiment of the present disclosure.

Optionally, FIG. 16 is a top view of another sensor provided by an embodiment of the present disclosure. As shown in FIG. 16, multiple sensing units 40 are disposed around a protrusion structure 20. The shielding structure 50 includes multiple shielding units 52, the multiple shielding units 52 have a one-to-one correspondence with have a one-to-one correspondence with have a one-to-one correspondence with the multiple sensing units 40; where each shielding unit 52 at least partially surrounds a respective one of the multiple sensing units 40.

In this embodiment, each sensing unit 40 is individually provided with a shielding unit 52, and the shielding unit 52 is provided for each sensing unit 40 so that the signal interference of the external signals to the respective sensing units 40 can be further shielded.

Figure 17:
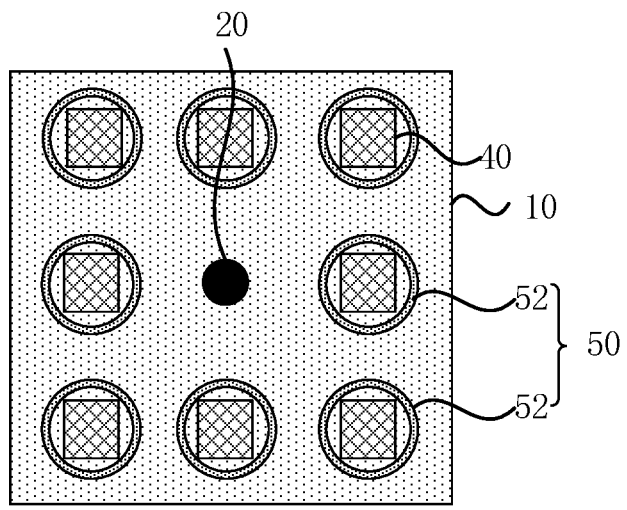
FIG. 17 is a top view of another strain sensor provided by an embodiment of the present disclosure.

It is to be noted that FIG. 16 just takes as an example a case where each shielding unit 52 partially surrounds a respective sensing unit 40, which does not limit the present disclosure. In other optional embodiments, each shielding unit 52 may also completely surround a respective sensing unit 40, for example, referring to FIG. 17.

Optionally, continually referring to FIG. 16, the shape of the shielding unit 52 includes an arc shape whose arc opening faces a respective shielding unit 40. The advantages of such configuration of surrounding the sensing unit 40 through the shielding unit 52 in the arc shape are that the structure is simple, and at the same time, the influence of the external signals to the sensing units 40 may be shielded.

Figure 18:
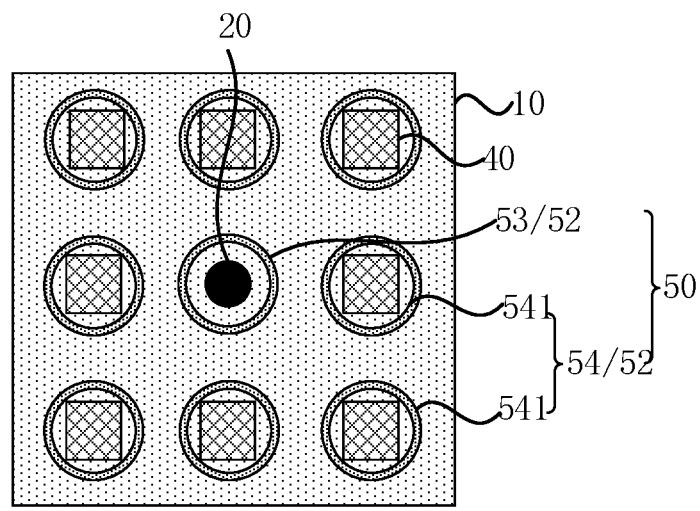
FIG. 18 is a top view of another strain sensor provided by an embodiment of the present disclosure.

Optionally, FIG. 18 is a top view of another sensor provided by an embodiment of the present disclosure. As shown in FIG. 18, the shielding structure includes at least two shielding units 52; the at least two the shielding units 52 includes a first shielding unit 53 and a second shielding unit 54; a perpendicular projection of the first shielding unit 53 on the plane where the flexible film 10 is located is located on a side, closer to the perpendicular projection of the protrusion structure 20 on the plane where the flexible film 10 is located, of a perpendicular projection of the second shielding unit 54 on the plane where the flexible film 10 is located; the second shielding unit 54 includes multiple shielding sub-units 541; each shielding sub-unit 541 corresponds to a respective sensing unit 40; the first shielding unit 53 is disposed around the protrusion structure 20; and each shielding sub-unit 541 is disposed around the respective shielding unit 40.

In the embodiment of the present disclosure, multiple shields are provided, that is, on one hand, the first shielding unit 53 is disposed around the protrusion structure 20 so that the external signals are shielded by the first shielding unit 53 from being sensed to the sensing units 40, and on the other hand, the second shielding unit 54 includes multiple shielding sub-units 541, and each shielding sub-unit 541 corresponds to a respective sensing unit 40, that is, each sensing unit 40 is surrounded by the respective shielding sub-unit 541, so that the influence of other signals on the sensing units 40 can be further prevented, and at the same time, signal crosstalk between adjacent sensing units 40 can be avoided, thereby further improving the detection accuracy.

Figure 19:
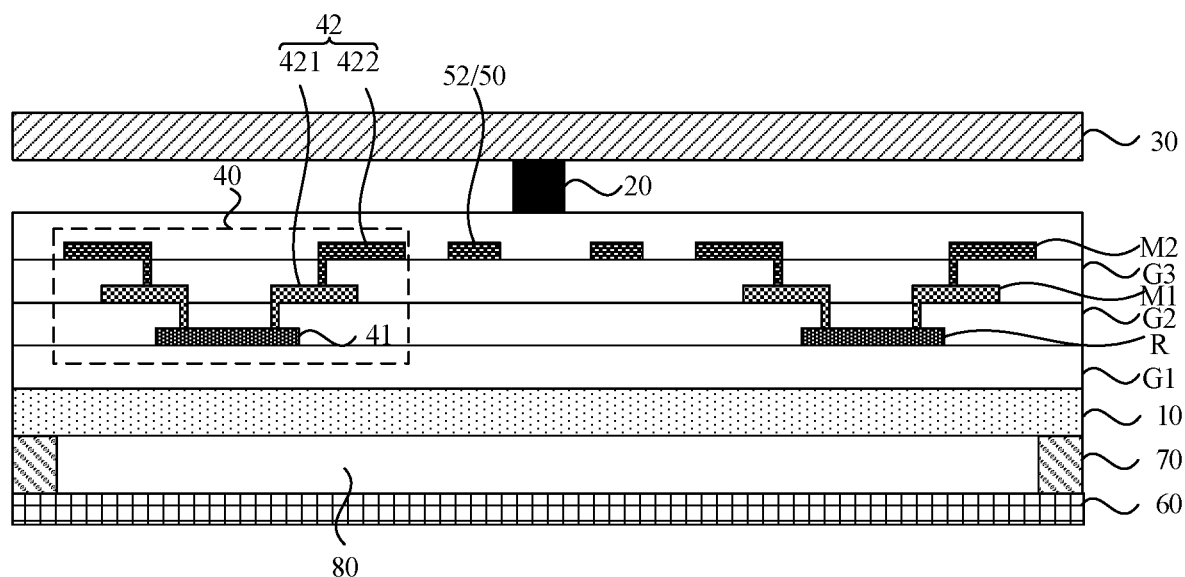
FIG. 19 is a structural view of a film layer of another strain sensor provided by an embodiment of the present disclosure.

Optionally, FIG. 19 is a structural view of a film layer of another sensor provided by an embodiment of the present disclosure. As shown in FIG. 19, each sensing unit 40 includes a sensing body 41 and a signal transmission line 42. The signal transmission line 42 includes a first signal transmission line 421 and a second signal transmission line 422. Each sensing unit 40 further includes a first insulating layer G1, a sensing layer R, a second insulating layer G2, a first metal layer M1, a third insulating layer G3 and a second metal layer M2 sequentially disposed on a side of the flexible film 10. The sensing layer R includes a semiconductor material; the sensing body 41 is located in the sensing layer R; and the first signal transmission line 421 is located in the first metal layer M1 and the second signal transmission line 422 is located in the second metal layer M2. Alternatively, the first signal transmission line 421 and the second signal transmission line 422 are located in the first metal layer M1, and a bridging structure of the first signal transmission line 421 and the second signal transmission line 422 is located in the second metal layer M2. Alternatively, the first signal transmission line 421 and the second signal transmission line 422 are located in the second metal layer M2, and a bridging structure of the first signal transmission line 421 and the second signal transmission line 422 is located in the first metal layer M1.

A processor applies a power supply drive signal to the sensing body 41 through the first signal transmission line 421, and when the flexible film 10 is strained, the sensing body 41 generates a corresponding detection signal and outputs the detection signal to the processor through the second signal transmission line 422, and the processor determines a magnitude of a pressure between the sensor 100 and an object based on the detection signal.

Figure 20:
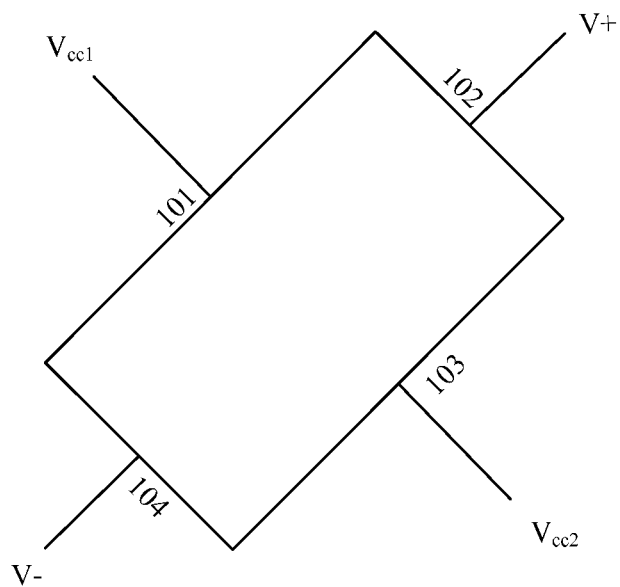
FIG. 20 is a structural view of a sensing body provided by an embodiment of the present disclosure.

Exemplarily, FIG. 20 is a structural view of a sensing body provided by an embodiment of the present disclosure. As shown in FIG. 20, the shape of the sensing body 41 is generally a quadrilateral, and a first connection terminal 101, a second connection terminal 102, a third connection terminal 103 and a fourth connection terminal 104 are located on a first side, a second side, a third side and a fourth side of the sensing body 41 respectively. The first side and the third side of the sensing body 41 are disposed opposite to each other, and the second side and the fourth side are disposed opposite each other. The first connection terminal 101 is electrically connected to a first power input signal line Vcc1, the second connection terminal 102 is electrically connected to a first induction signal measurement signal line V+, the third connection terminal 103 is electrically connected to a second power input signal line Vcc2 and the fourth connection terminal 104 is electrically connected to a second induction signal measurement signal line V−. The first power input signal line Vcc1 and the second power input signal line Vcc2 are used for inputting a power supply drive signal to the sensing body 41. The first induction signal measurement signal line V+ and the second induction signal measurement signal line V− are used for outputting a touch pressure detection signal from the sensing body 41. The first signal transmission line 421 includes the first power input signal line Vcc1 and the second power input signal line Vcc2, and the second signal transmission line 422 includes the first induction signal measurement signal line V+ and the second induction signal measurement signal line V−.

Optionally, continually referring to FIG. 19, the shielding structure 50 includes one shielding unit 52; the shielding unit 52 is located in the first metal layer M1 or the second metal layer M2.

In this embodiment, it is ensured that the shielding unit 52 is disposed on a same layer as a film layer already existing in the sensor 100, so that a preparation method of the shielding unit 52 is simple and the arrangement relationship of the film layers in the whole sensor 100 is simple, which makes it easy to meet thin design requirements of the sensor 100. FIG. 19 just illustrates by using an example in which the first signal transmission line 421 is located in the first metal layer M1, the second signal transmission line 422 is located in the second metal layer M2, and the shielding unit 51 is disposed in the same layer as the second signal transmission line 422.

Figure 21:
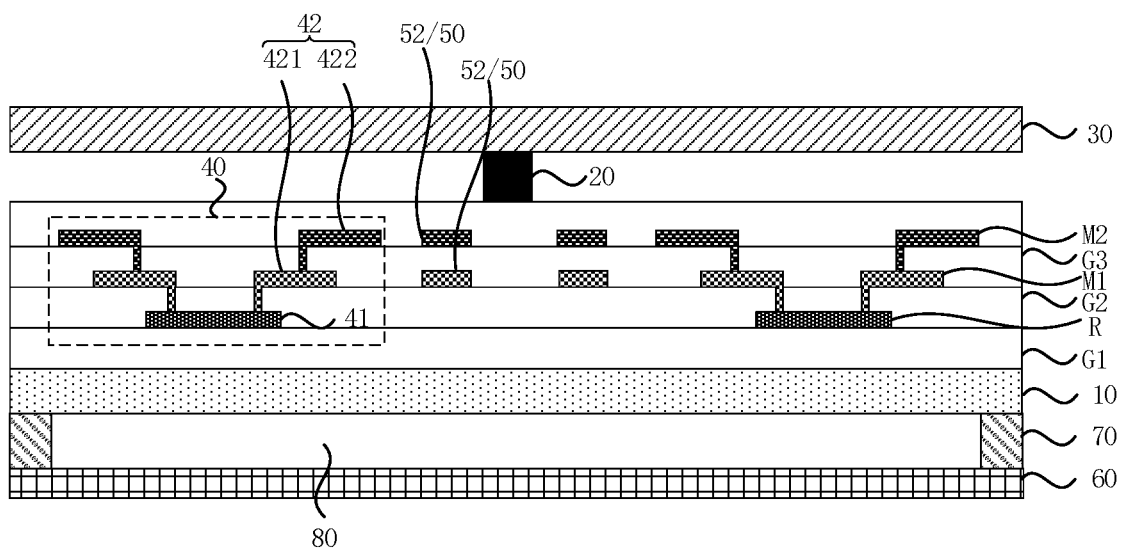
FIG. 21 is a structural view of a film layer of another sensor provided by an embodiment of the present disclosure.

Optionally, FIG. 21 is a structural view of a film layer of another sensor provided by an embodiment of the present disclosure. As shown in FIG. 21, the shielding structure 50 includes M shielding unit 52. The M shielding units 52 are located in the first metal layer M1. Alternatively, the M shielding units 52 are located in the second metal layer M2. Alternatively, at least part of the M shielding units 52 are located in the first metal layer M1 and at least part of the shielding units 52 are located in the second metal layer M2.

In this embodiment, the shielding structure 50 includes the M shielding units 52, on the basis of ensuring that the shielding structure 50 has a better shielding effect on the external signals, the shielding units 52 are arranged on the same layer as the film layer already existing in the sensor 100, so that the arrangement relationship of the film layers in the whole sensor 100 is simple, which makes it easy to meet thin design requirements of the sensor 100 is easily to be implemented. FIG. 21 just illustrates by using an example in which the shielding structure 50 includes two shielding units 52, the first signal transmission line 421 is located in the first metal layer M1, the second signal transmission line 422 is located in the second metal layer M2, and one of the two shielding units 52 is disposed in the same layer as the first signal line 421, and the other one of the two shielding units 51 is disposed in the same layer as the second signal line 422.

Figure 22:
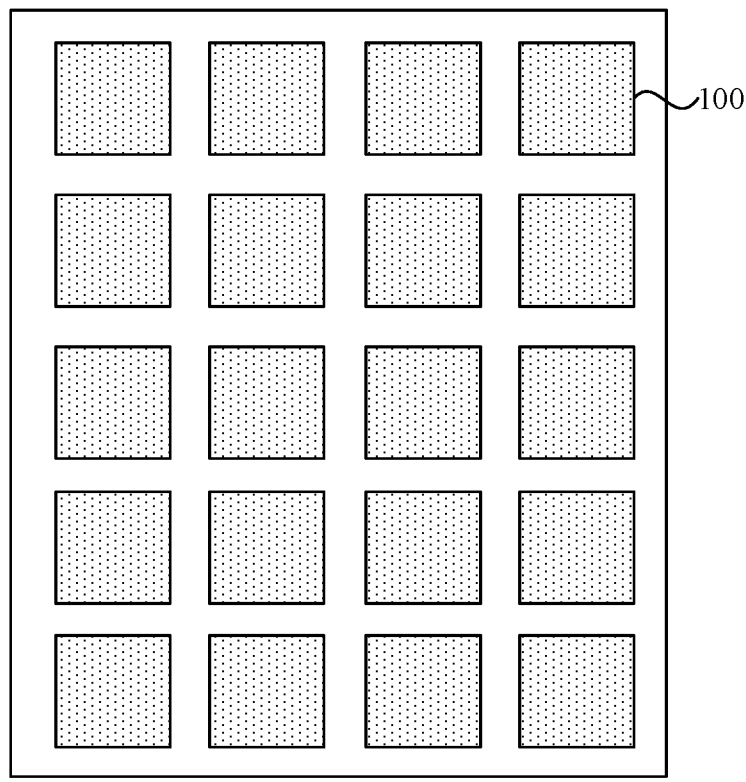
FIG. 22 is a structural view of a display panel provided by an embodiment of the present disclosure.

Based on the same concept, an embodiment of the present disclosure further provides a display panel. The display panel includes multiple sensors according to any one of embodiments in the present disclosure. Exemplarily, FIG. 22 is a structural view of a display panel provided by an embodiment of the present disclosure. As shown in FIG. 22, the display panel 200 includes sensors 100 in the embodiments described above.

When a touch body (e.g., a finger) touches the display panel 200, a protrusion structure inside the sensor 100 comes into contact with a flexible film and enables the flexible film to generate a strain. The strain of the flexible film causes a sensing unit to respond, that is, the sensing unit outputs a detection signal to a driver chip, which determines a magnitude and direction of the pressure and a touching position based on the detection signal. In this embodiment, since the shielding structure is disposed around the protrusion structure, the following problem can be avoided: the static electricity on the finger influences the sensing unit due to the contact between the protrusion structure and the flexible film when the finger touches the display panel, thereby influencing the detection accuracy.

Optionally, the display panel provided by the embodiment of the present disclosure may be an organic light-emitting diode display panel or a liquid crystal display panel.

Figure 23:
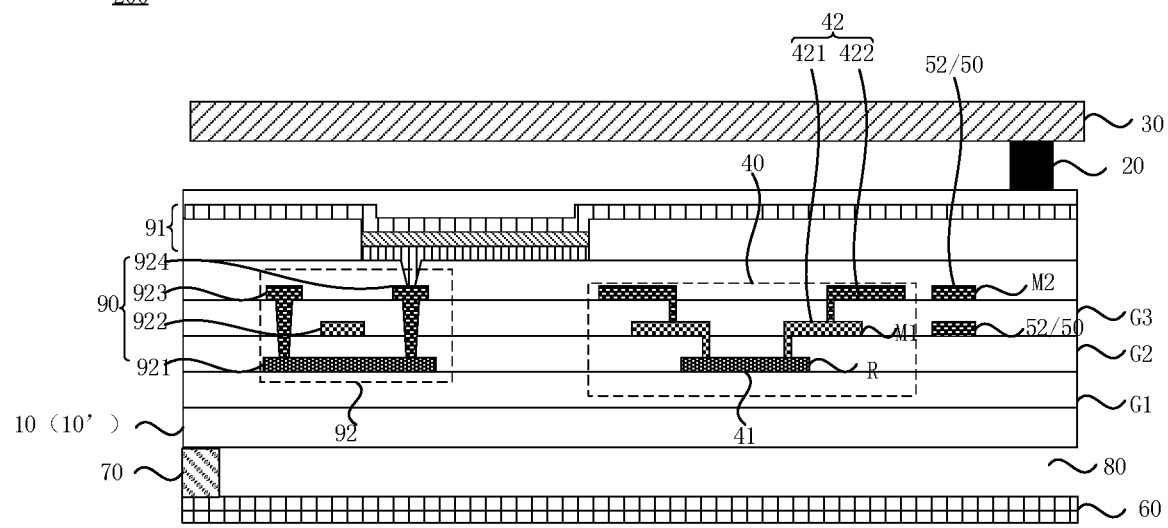
FIG. 23 is a structural view of a part of film layers of a display panel provided by an embodiment of the present disclosure.

Exemplarily, FIG. 23 is a structural view of a part of film layers of a display panel provided by an embodiment of the present disclosure. As shown in FIG. 23, in a case where the display panel 200 is an organic light-emitting display panel, the organic light-emitting display panel includes a first substrate 10'; a driving circuit layer 90 on a side of the first substrate 10'; and an organic light-emitting element layer 91 located on a side of the driving circuit layer 90 facing away from the first substrate 10', where the first substrate 10' is multiplexed as the flexible film 10; the protrusion structure 20 is located on a side, facing away from the first substrate 10', of the organic light-emitting element layer 91. That is, in a case where the display panel 200 is an organic light-emitting display panel, the flexible film 10 of the sensor 100 and the first substrate 10' are the same structure so that the structure of the sensor 100 is simple. A structure inside the sensing unit 40 may be disposed in a same layer as a structure inside the organic light-emitting display panel, or the sensing unit 40 may be disposed separately. For example, the sensing unit 40 is located on a side, facing away from the first substrate 10', of the organic light-emitting element layer 91, which is not specifically limited in this embodiment.

In a case where the structure in the sensing unit 40 is disposed in the same layer as the structure inside the organic light-emitting display panel, continually referring to FIG. 23, each sensing unit 40 includes a sensing body 41 and a signal transmission line 42. The signal transmission line 42 includes a first signal transmission line 421 and a second signal transmission line 422. each sensing unit 40 further includes a first insulating layer G1, a sensing layer R, a second insulating layer G2, a first metal layer M1, a third insulating layer G3 and a second metal layer M2 sequentially disposed on a side of the flexible film 10, where the sensing layer R includes a semiconductor material or a metal material. In a case where the sensing layer R includes the semiconductor material, the strain sensitivity of the sensing unit 40 can be improved. The sensing body 41 is located in the sensing layer R. The first signal transmission line 421 is located in the first metal layer M1, and the second signal transmission line 422 is located in the second metal layer M2. Alternatively, the first signal transmission line 421 and the second signal transmission line 422 are located in the first metal layer M1, and a bridging structure of the first signal transmission line 421 and the second signal transmission line 422 is located in the second metal layer M2. Alternatively, the first signal transmission line 421 and the second signal transmission line 422 are located in the second metal layer M2, and a bridging structure of the first signal transmission line 421 and the second signal transmission line 422 is located in the first metal layer M1. The driving circuit layer 90 includes at least one thin film transistor 92, and each thin film transistor 92 includes an active layer 921, a gate 922, a source 923 and a drain 924. The sensing body 41 and the active layer 921 are located in the sensing layer R, the gate 922 is located in the first metal layer M1, and the source 923 and the drain 924 are located in the second metal layer M2. In a case where the shielding structure 50 includes one shielding unit 52, the one shielding unit 52 is located in the first metal layer M1 or the second metal layer M2. In a case where the shielding structure 50 includes M shielding units 52, the M shielding units 52 are located in the first metal layer M1; or the M shielding units 52 are located in the second metal layer M2; or at least part of M shielding units 52 are located in the first metal layer M1 and at least part of the shielding units 52 are located in the second metal layer M2. That is, the structure in the sensing unit 40 and the shielding structure 50 are disposed in the same layer as the structure in the driving circuit layer 90 of the organic light-emitting display panel. In this way, it is ensured that the arrangement relationship of the film layers, as well as the preparation method, of the whole organic light-emitting display panel is simple, which is beneficial to implementing the thin design requirements of the whole organic light-emitting display panel.

It is to be noted that FIG. 23 just illustrates by using an example in which the shielding structure 50 includes two shielding units 52, the first signal transmission line 421 is located in the first metal layer M1, the second signal transmission line 422 is located in the second metal layer M2, and one of the two shielding units 52, the first signal transmission line 421 and a gate 922 are disposed in a same layer, and the other one of the two shielding units 52, the first signal transmission line 422, the source 923 and the drain 924 are disposed in a same layer.

Figure 24:
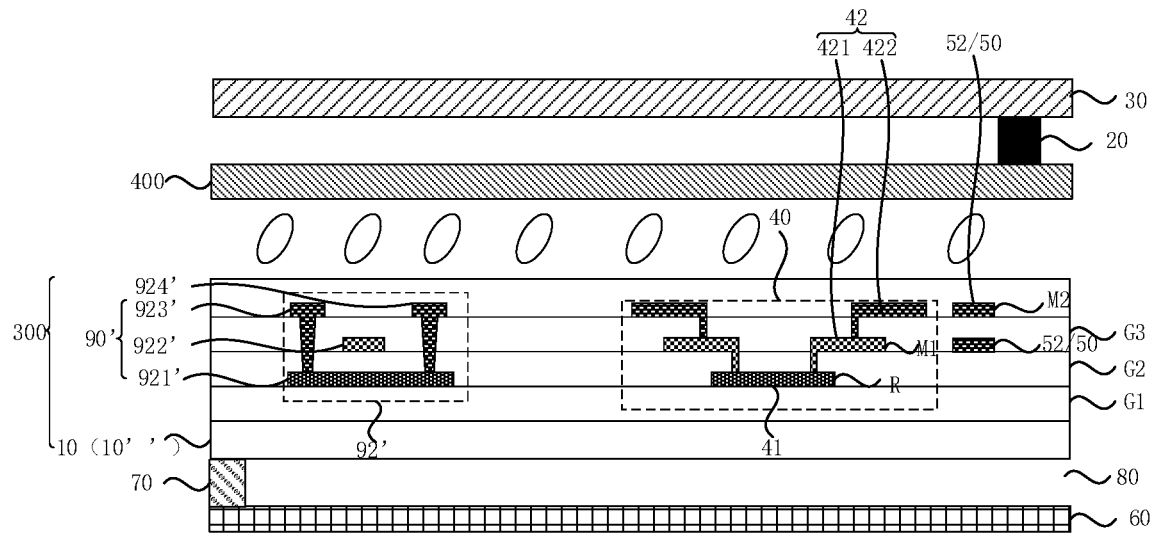
FIG. 24 is a structural view of a part of film layers of another display panel provided by an embodiment of the present disclosure.

Exemplarily, FIG. 24 is a structural view of a part of film layers of another display panel provided by an embodiment of the present disclosure. As shown in FIG. 24, in a case where a display panel 200 is a liquid crystal display panel, the liquid crystal display panel includes an array substrate 300 and a color filter substrate 400 disposed opposite to each other. The array substrate 300 includes a second substrate 10" and a driving circuit layer 90' located on a side, facing toward the color filter substrate 400, of the second substrate 10". The second substrate 10" is multiplexed as the flexible film 10, and the protrusion structure 20 is located on a side, facing away from the array substrate 300, of the color filter substrate 400. That is, in a case where the display panel 200 is the liquid crystal display panel, the flexible film 10 of the sensor 100 and the second substrate 10" are the same structure so that the structure of the sensor 100 is simple. A structure inside the sensing unit 40 may be disposed in a same layer as a structure inside the liquid crystal display panel. The sensing unit 40 may also be disposed separately. For example, the sensing unit 400 is located on a side, facing away from the second substrate 10", of the color filter substrate 400, which is not specifically limited in this embodiment.

In a case where the structure in the sensing unit 40 is disposed in the same layer as the structure inside the liquid crystal display panel, continually referring to FIG. 24, each sensing unit 40 includes a sensing body 41 and a signal transmission line 42. The signal transmission line 42 includes a first signal transmission line 421 and a second signal transmission line 422. Each sensing unit 40 further includes a first insulating layer G1, a sensing layer R, a second insulating layer G2, a first metal layer M1, a third insulating layer G3 and a second metal layer M2 sequentially disposed on a side of the flexible film 10. The sensing layer R includes a semiconductor material or a metal material. In a case where the sensing layer R includes a semiconductor material, the strain sensitivity of the sensing unit 40 can be improved. The sensing body 41 is located in the sensing layer R. The first signal transmission line 421 is located in the first metal layer M1 and the second signal transmission line 422 is located in the second metal layer M2. Alternatively, the first signal transmission line 421 and the second signal transmission line 422 are located in the first metal layer M1, and a bridging structure of the first signal transmission line 421 and the second signal transmission line 422 is located in the second metal layer M2. Alternatively, the first signal transmission line 421 and the second signal transmission line 422 are located in the second metal layer M2, and a bridging structure of the first signal transmission line 421 and the second signal transmission line 422 is located in the first metal layer M1. A driving circuit layer 90' in the liquid crystal display panel includes at least one thin film transistor 92', and each thin film transistor 92' includes an active layer 921', a gate 922', a source 923' and a drain 924'. The sensing body 41 and the active layer 921' are located in the sensing layer R, the gate 922' is located in the first metal layer M1, and the source 923' and the drain 924' are located in the second metal layer M2. In a case where the shielding structure 50 includes one shielding unit 51, the one shielding unit 51 is located in the first metal layer M1 or the second metal layer M2. In a case where the shielding structure 50 includes M shielding units 51, the M shielding units 51 are located in the first metal layer M1; or the M shielding units 51 are located in the second metal layer M2; or at least part of the shielding units 51 are located in the first metal layer M1 and at least part of the shielding units 51 are located in the second metal layer M2. That is, the structure in the sensing unit 40 and the shielding structure 50 are disposed in the same layer as the structure in the driving circuit layer 90 of the liquid crystal display panel. In this way, it is ensured that the arrangement relationship of the film layers of the whole liquid crystal display panel is simple and a preparation method of the whole liquid crystal display panel is simple, which is beneficial to implementing the thin design requirements of the liquid crystal display panel.

It is to be noted that FIG. 24 just illustrates by using an example in which the shielding structure 50 includes two shielding units 52, the first signal transmission line 421 is located in the first metal layer M1, the second signal transmission line 422 is located in the second metal layer M2, and one of the two shielding units 52, the first signal transmission line 421 and a gate 922' are disposed in the same layer, and the other one of the two shielding units 52, the first signal transmission line 422, the source 923' and the drain 924' are disposed in the same layer.

Alternatively, continually referring to FIGS. 23 and 24, the display panel 200 further includes: a second carrier substrate 60 located on a side, facing away from the sensing units 40, of the flexible film 10 (or 10'); a support portion 70 located on a side, facing toward the flexible film 10 (10'), of the second carrier substrate 60, where the support portion 70 and the second carrier substrate 60 may be structures independent from each other, or may be an integrated structure; the second carrier substrate 60 and the support portion 70 constitute a cavity structure 80; the flexible film 10 is disposed on the support portion 70, where the perpendicular projection of the sensing units 40 on the plane where the flexible film 10 is located is within a perpendicular projection of the cavity structure 80 on the plane where the flexible film 10 is located; and the perpendicular projection of the protrusion structure 20 on the plane where the flexible film 10 (10') is located is within the perpendicular projection of the cavity structure 80 on the plane where the flexible film 10 (10') is located.

In this embodiment, the second carrier substrate 60 and the support portion 70 constitute the cavity structure 80, and then the flexible film 10 (10') is disposed on the support portion 70 so that the cavity structure 80 provides a deformed space for the flexible film 10 (10').

It may be understood that, internal structures of different display panels are slightly different, and the above is just one example, and does not limit the present disclosure. Those skilled in the art may configure a position of an internal structure of the sensor according to an internal structure of the display panel as long as the internal structures of the sensor and the display panel may be configured in the same layer so that the arrangement relationship of the film layers of the whole display panel is simple and the thin design requirements of the display panel can be easily implemented.

Based on the same concept, an embodiment of the present disclosure further provides a display device. The display device includes the display panel described in any embodiment of the present disclosure. Therefore, the display device provided by the embodiment of the present disclosure has the corresponding beneficial effects of the display panel provided by the embodiments of the present disclosure, which is not repeated here. Exemplarily, the display device may be a mobile phone, a computer, a smart wearable device (for example, a smart watch), an onboard display device, or another electronic device, which is not limited in the embodiment of the present disclosure.

Figure 25:
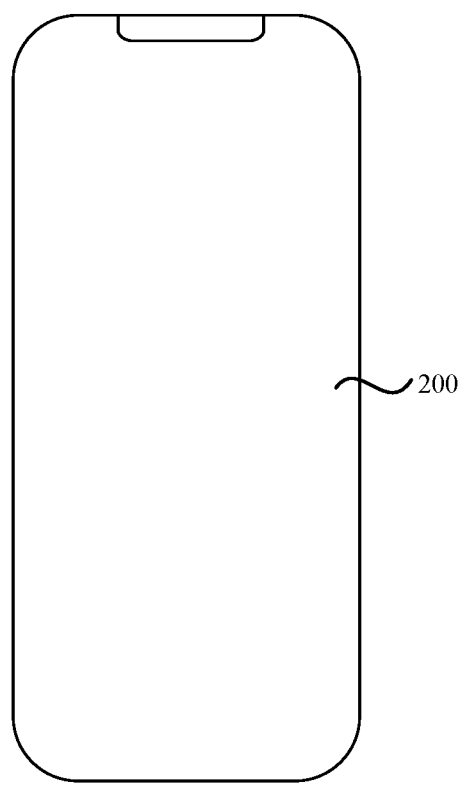
FIG. 25 is a structural view of a display device provided by an embodiment of the present disclosure.

Exemplarily, FIG. 25 is a structural view of a display device provided by an embodiment of the present disclosure. As shown in FIG. 25, the display device 1000 includes the display panel 200 in the embodiments described above.

Based on the same concept, an embodiment of the present disclosure further provides a robot. At least one sensor provided by any one of the above embodiments is disposed on a body surface of the robot, for example, at a finger of the robot, and the at least one sensor detects a pressure when the robot picks and places an object by hand, thereby avoiding the problem that the object is damaged due to a too large force or the object is unsuccessfully grasped due to a too small force.

It is to be noted that the above are merely preferred embodiments of the present disclosure and the technical principles used therein. It is to be understood by those skilled in the art that the present disclosure is not limited to the particular embodiments described herein. Those skilled in the art can make various apparent modifications, adaptations and substitutions without departing from the scope of the present disclosure. Therefore, while the present disclosure has been described in detail via the preceding embodiments, the present disclosure is not limited to the preceding embodiments and may include other equivalent embodiments without departing from the concept of the present disclosure. The scope of the present disclosure is determined by the scope of the appended claims.

What is claimed is:

1. A pressure sensor, comprising:
a flexible film;
a first carrier substrate disposed opposite to and spaced apart from the flexible film;
a protrusion structure disposed on a side, facing toward the flexible film, of the first carrier substrate;
a plurality of sensing units located on a side, facing toward the first carrier substrate, of the flexible film, wherein a perpendicular projection of the protrusion structure on a plane where the flexible film is located does not overlap perpendicular projections of the plurality of sensing units on the plane where the flexible film is located; and
a shielding structure disposed at least partially around the protrusion structure, wherein a perpendicular projection of the shielding structure on the plane where the flexible film is located is between the perpendicular projection of the protrusion structure on the plane where the flexible film is located and perpendicular projections of the plurality of sensing units on the plane on which the flexible film is located.

2. The pressure sensor of claim 1, further comprising:
a second carrier substrate located on a side, facing away from the plurality of sensing units, of the flexible film;
a support portion located on a side, facing toward the flexible film, of the second carrier substrate, wherein the second carrier substrate and the support portion constitute a cavity structure;
wherein the flexible film is disposed on the support portion;
wherein the perpendicular projections of the plurality of sensing units on the plane where the flexible film is located are within a perpendicular projection of the cavity structure on the plane where the flexible film is located; and the perpendicular projection of the protrusion structure on the plane where the flexible film is located is within the perpendicular projection of the cavity structure on the plane where the flexible film is located.

3. The pressure sensor of claim 1, wherein the plurality of sensing units are disposed around the protrusion structure; and
a distance from the perpendicular projection of the shielding structure on the plane where the flexible film is located to the perpendicular projection of the protrusion structure on the plane where the flexible film is located is greater than a distance from the perpendicular projection of the shielding structure on the plane where the flexible film is located to a perpendicular projection of each of the plurality of sensing units on the plane where the flexible film is located.

4. The pressure sensor of claim 1, wherein the shielding structure comprises M shielding units, wherein the M shielding units are located in a same film layer or partially in different film layers; wherein M is a positive integer greater than or equal to 2.

5. The pressure sensor of claim 4, wherein the shielding unit comprises a shielding ring, and wherein the shielding ring is disposed around the protrusion structure.

6. The pressure sensor of claim 5, wherein the shielding ring comprises a closed shielding ring or a non-closed shielding ring, wherein the non-closed shield ring has openings along the ring.

7. The pressure sensor of claim 6, wherein the shielding structure comprises a plurality of non-closed shielding rings; and
wherein the openings of adjacent ones of the plurality of non-closed shielding rings are staggered.

8. The pressure sensor of claim 5, wherein the shielding ring comprises a square, a rectangular, a circular ring, an elliptical ring, an N-point star ring or an N-sided ring, wherein N is a positive integer greater than or equal to 3.

9. The pressure sensor of claim 8, wherein in a case where the shielding ring comprises the N-point star ring, each outwardly-projecting sharp point of the N-point star ring faces toward a gap between respective two adjacent ones of the plurality of sensing units; or
in a case where the shielding ring comprises the N-sided ring, each corner of the N-side ring faces toward a gap between respective two adjacent ones of the plurality of sensing units.

10. The pressure sensor of claim 4, wherein the plurality of sensing units are disposed around the protrusion structure;

wherein the shielding structure comprises a plurality of shielding units; wherein the plurality of shielding units have a one-to-one correspondence with the plurality of sensing units; and wherein each of the plurality of shielding units at least partially surrounds a respective one of the plurality of sensing units.

11. The pressure sensor of claim 10, wherein a shape of each of the plurality of shielding units comprises an arc shape whose arc opening is configured to face a respective one of the plurality of shielding units.

12. The pressure sensor of claim 4, wherein the shielding structure comprises at least two shielding units; the at least two shielding units comprise a first shielding unit and a second shielding unit;

wherein a perpendicular projection of the first shielding unit on the plane where the flexible film is located is located on a side, facing toward the perpendicular projection of the protrusion structure on the plane where the flexible film is located, of a perpendicular projection of the second shielding unit on the plane where the flexible film is located;

wherein the second shielding unit comprises a plurality of shielding sub-units; wherein the plurality of shielding sub-units have a one-to-one correspondence with the plurality of sensing units;

wherein the first shielding unit is disposed around the protrusion structure; and wherein each of the plurality of shielding sub-units is disposed around a respective one of the plurality of shielding units.

13. The pressure sensor of claim 4, wherein each of the plurality of sensing units comprises: a sensing body and a signal transmission line;

wherein the signal transmission line comprises a first signal transmission line and a second signal transmission line;

wherein each of the plurality of sensing units further comprises: a first insulating layer, a sensing layer, a second insulating layer, a first metal layer, a third insulating layer and a second metal layer sequentially disposed on a side of the flexible film; wherein the sensing layer comprises a semiconductor material;

wherein the sensing body is located in the sensing layer; and wherein the first signal transmission line is located in the first metal layer and the second signal transmission line is located in the second metal layer; or wherein the first signal transmission line and the second signal transmission line are located in the first metal layer, and wherein a bridging structure connecting the first signal transmission line and the second signal transmission line is located in the second metal layer; or wherein the first signal transmission line and the second signal transmission line are located in the second metal layer, and wherein a bridging structure connecting the first signal transmission line and the second signal transmission line is located in the first metal layer.

14. A display panel, comprising the pressure sensor of claim 1.

15. The display panel of claim 14, wherein the display panel is an organic light emitting display panel; and wherein the organic light emitting display panel comprises:

a first substrate;

a driving circuit layer located on a side of the first substrate; and an organic light emitting element layer located on a side of the driving circuit layer facing away from the first substrate;

wherein the first substrate is multiplexed as the flexible film; and wherein the protrusion structure is located on a side, facing away from the first substrate, of the organic light emitting element layer.

16. The display panel of claim 14, wherein the display panel is a liquid crystal display panel; and the liquid crystal display panel comprises:

an array substrate and a color filter substrate disposed opposite to each other;

wherein the array substrate comprises a second substrate and a driving circuit layer located on a side, facing toward the color filter substrate, of the second substrate;

wherein the second substrate is multiplexed as the flexible film; and wherein the protrusion structure is located on a side, facing away from the array substrate, of the color filter substrate.

17. The display panel of claim 15, wherein each of the plurality of sensing units comprises: a sensing body and a signal transmission line; wherein the signal transmission line comprises a first signal transmission line and a second signal transmission line;

wherein each of the plurality of sensing units further comprises: a first insulating layer, a sensing layer, a second insulating layer, a first metal layer, a third insulating layer and a second metal layer sequentially disposed on a side of the flexible film; wherein the sensing layer comprises a semiconductor material;

wherein the first signal transmission line is located in the first metal layer and the second signal transmission line is located in the second metal layer; or the first signal transmission line and the second signal transmission line are located in the first metal layer, and wherein a bridging structure of the first signal transmission line and the second signal transmission line is located in the second metal layer; or wherein the first signal transmission line and the second signal transmission line are located in the second metal layer, and wherein a bridging structure connecting the first signal transmission line and the second signal transmission line is located in the first metal layer;

wherein the driving circuit layer comprises at least one thin film transistor; each of the at least one thin film transistor comprises an active layer, a gate, a source and a drain;

wherein the sensing body and the active layer are located in the sensing layer;

wherein the gate is located in the first metal layer; and wherein the source and the drain are located in the second metal layer.

18. The display panel of claim 17, wherein the shielding structure comprises one shielding unit; and wherein the one shielding unit is located in the first metal layer or the second metal layer.

19. The display panel of claim 17, wherein the shielding structure comprises M shielding units; wherein the M shielding units are located in the first metal layer; or the M shielding units are located in the second metal layer; or part of the M shielding units are located in the first metal layer and part of the M shielding units are located in the second metal layer.

20. A display device, comprising the display panel of claim 14.

* * * * *